United States Patent
Kang

(10) Patent No.: US 9,671,446 B2
(45) Date of Patent: Jun. 6, 2017

(54) NOISE DETECTION CIRCUIT AND SEMICONDUCTOR SYSTEM USING THE SAME

(71) Applicant: SK hynix Inc., Icheon-si Gyeonggi-do (KR)

(72) Inventor: Tae Wook Kang, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 355 days.

(21) Appl. No.: 14/310,661

(22) Filed: Jun. 20, 2014

(65) Prior Publication Data

US 2015/0276841 A1    Oct. 1, 2015

(30) Foreign Application Priority Data

Mar. 27, 2014   (KR) .................. 10-2014-0036214

(51) Int. Cl.
G01R 29/26 (2006.01)
G01R 31/317 (2006.01)
G01R 31/30 (2006.01)

(52) U.S. Cl.
CPC ....... *G01R 29/26* (2013.01); *G01R 31/31708* (2013.01); *G01R 31/3004* (2013.01)

(58) Field of Classification Search
USPC ....... 324/614, 613, 672, 679, 76.39; 714/48; 327/291, 306, 175, 158, 149, 156, 172, 327/295, 115, 145, 147, 212; 365/233.1, 365/233.11, 233.12; 326/26, 96; 375/227; 713/500; 257/E29.001
See application file for complete search history.

(56) References Cited

U.S. PATENT DOCUMENTS

2013/0154702 A1* 6/2013 Kim .................. H03L 7/089
327/158

FOREIGN PATENT DOCUMENTS

KR    100431290 B1    4/2004
KR    101097467 B1    12/2011

* cited by examiner

*Primary Examiner* — Melissa Koval
*Assistant Examiner* — Nasima Monsur
(74) *Attorney, Agent, or Firm* — William Park & Associates Ltd.

(57) ABSTRACT

A noise detection circuit may include a divider configured to receive a clock signal and a clock bar signal, divide the clock signal and the clock bar signal, and generate a first divided signal and a second divided signal. The noise detection circuit may also include a noise detection reference block configured to reflect a power supply voltage level variation on the first divided signal and the second divided signal, and generate a first reference signal and a second reference signal, and a duty sensing circuit configured to generate first duty information and second duty information of the clock signal in response to the first reference signal and the second reference signal. The noise detection circuit may also include a detection circuit configured to generate a noise detection signal in response to the first duty information and the second duty information.

10 Claims, 5 Drawing Sheets

NOISE DETECTION CIRCUIT AND SEMICONDUCTOR SYSTEM USING THE SAME

CROSS-REFERENCES TO RELATED APPLICATION

The present application claims priority under 35 U.S.C. §119(a) to Korean application number 10-2014-0036214, filed on Mar. 27, 2014, in the Korean Intellectual Property Office, which is incorporated herein by reference in its entirety.

BACKGROUND

1. Technical Field

Various embodiments generally relate to a semiconductor circuit, and more particularly, to a noise detection circuit and a semiconductor system using the same.

2. Related Art

A semiconductor circuit performs all operations with the use of a power supply voltage.

A semiconductor circuit, that uses the power supply voltage, is likely to have an operation error when there is a sudden variation in the power supply voltage. This sudden variation in the power supply voltage may be caused by noise. Thus, noise may cause an operation error to occur within a semiconductor circuit.

Accordingly, to cope with operation errors caused by noise, it may be important to detect noise generation in the power supply voltage.

SUMMARY

In an embodiment, a noise detection circuit may include a divider configured to receive a clock signal and a clock bar signal, divide the clock signal and the clock bar signal, and generate a first divided signal and a second divided signal, and a noise detection reference block configured to reflect a power supply voltage level variation on the first divided signal and the second divided signal, and generate a first reference signal and a second reference signal. The noise detection circuit may also include a duty sensing circuit configured to generate first duty information and second duty information of the clock signal in response to the first reference signal and the second reference signal, and a detection circuit configured to generate a noise detection signal in response to the first duty information and the second duty information.

In an embodiment, a semiconductor system may include a memory configured to selectively activate an error detecting function or a noise detecting function in response to a control signal, and accordingly, output an error detection code or a noise detection signal. The semiconductor system may also include a memory controller configured to determine an operation state of the memory and provide the control signal to the memory, and provide a corresponding command to the memory in response to the noise detection signal.

In an embodiment, a noise detection circuit may include a divider configured to receive a clock signal and a clock bar signal, divide the clock signal and the clock bar signal, and generate a first divided signal and a second divided signal, and a detection circuit configured to generate a noise detection signal with regards the first divided signal and the second divided signal.

DETAILED DESCRIPTION

Hereinafter, a noise detection circuit and a semiconductor system using the same according to the present disclosure will be described with reference to the accompanying drawings through various examples of embodiments.

Various embodiments may be directed to a noise detection circuit capable of exactly detecting noise generation in a power supply voltage and a semiconductor system using the same.

Figure 1:
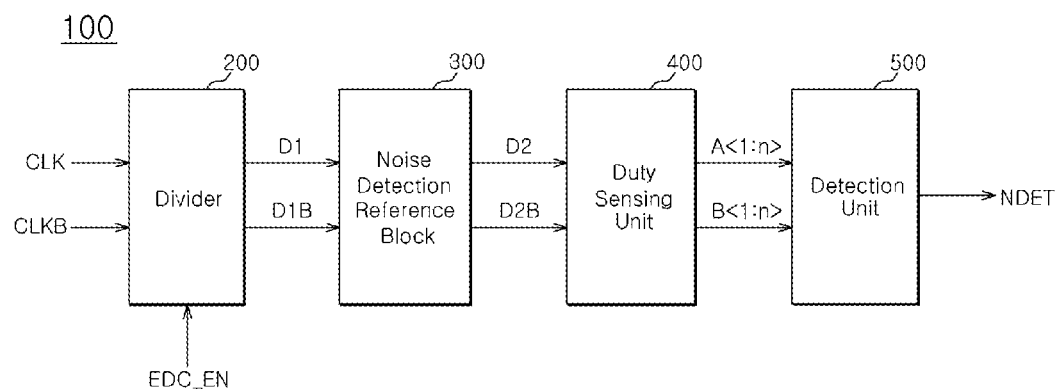
FIG. 1 is a block diagram representation of a noise detection circuit in accordance with an embodiment.

Referring FIG. 1, a noise detection circuit 100 in accordance with an embodiment may include a divider 200 and a noise detection reference block 300. The noise detection circuit 100 may also include a duty sensing circuit 400 and a detection circuit 500.

The divider 200 may be configured to divide a clock signal CLK and a clock bar signal CLKB. Then the divider 200 may generate first and second divided signals D1 and D1B using the divided clock signal CLK and clock bar signal CLKB.

The divider 200 may be configured to be activated in response to a control signal EDC_EN.

The noise detection reference block 300 may be configured to reflect a power supply voltage level variation on the first and second divided signals D1 and D1B, and generate first and second reference signals D2 and D2B.

The noise detection reference block 300 may include and use an inverter chain. The inverter chain performs a delay operation for an input signal. The delay operation may implement a scheme of repeatedly inverting the input signal, according to the structural characteristic of the inverter chain. The inverter chain may have a characteristic that is sensitive to a variation of a power supply voltage (for example, VDD) level. That is to say, since a power supply voltage level variation is reflected on an input signal delay operation, the inverter chain may be used as a noise detection reference.

The noise detection reference block 300 may be configured to delay the respective first and second divided signals D1 and D1B by a predetermined time. The noise detection reference block 300 may also generate the first and second reference signals D2 and D2B, and reflect the power supply voltage level voltage variation on the operation of delaying the first and second divided signals D1 and D1B.

The duty sensing circuit 400 may be configured to generate first duty information A<1:n> and second duty information B<1:n>. The first duty information A<1:n> and second duty information B<1:n> may be generated in response to the first and second reference signals D2 and D2B received by the duty sensing circuit 400.

The first duty information A<1:n> may be the high pulse width information of the clock signal CLK. The second duty information B<1:n> may be the low pulse width information of the clock signal CLK.

The detection circuit 500 may be configured to generate a noise detection signal NDET. The noise detection signal NDET may be generated in response to the first duty information A<1:n> and the second duty information B<1:n> received by the detection circuit 500.

Figure 2:
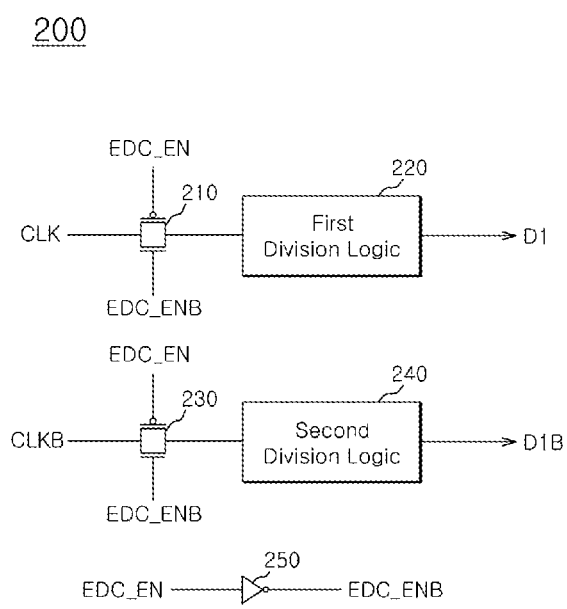
FIG. 2 is a circuit diagram representation illustrating the internal configuration of the divider illustrated in FIG. 1.

Referring to FIG. 2, the divider 200 may include first and second transmission gates 210 and 230. The divider 200 may also include first and second division logics 220 and 240 and an inverter 250.

The inverter 250 may be configured to invert the control signal EDC_EN. Then, the inverter 250 may generate an inverted control signal EDC_ENB.

The first transmission gate 210 may be configured to transmit the clock signal CLK to the first division logic 220. When the control signal EDC_EN is deactivated (to a logic low), the first transmission gate 210 may transmit the clock signal CLK to the first division logic 220.

The first division logic 220 may be configured to divide the clock signal CLK transmitted through the first transmission gate 210. Then, the first division logic 220 may generate the first divided signal D1.

When the control signal EDC_EN is deactivated, the second transmission gate 230 may be configured to transmit the clock bar signal CLKB to the second division logic 240.

The second division logic 240 may be configured to divide the negative clock signal CLKB transmitted through the second transmission gate 230. Then, the second division logic 240 may generate the second divided signal D1B.

Figure 3:
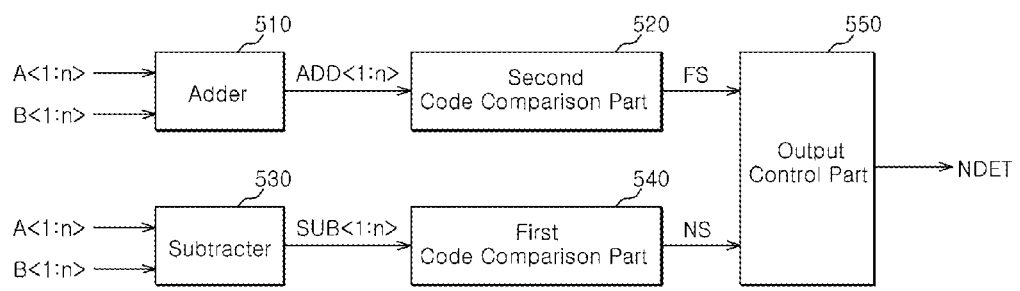
FIG. 3 is a block diagram representation illustrating an example of a configuration of the detection circuit illustrated in FIG. 1.

Referring to FIG. 3, the detection circuit 500 may include an adder 510, a second code comparison part 520, and a subtractor 530. The detection circuit 500 may also include a first code comparison part 540 and an output control part 550.

The subtractor 530 may be configured to generate a first code SUB<1:n> by subtracting the second duty information B<1:n> from the first duty information A<1:n>.

The first code comparison part 540 may be configured to compare a stored first reference code with the first code SUB<1:n>. Then the first code comparison part 540 may generate a duty error determination signal NS. The duty error determination signal NS may be generated by comparing the stored first reference code with the first code SUB<1:n>.

The first code comparison part 540 may be configured to activate the duty error determination signal NS. When the code value of the first code SUB<1:n> is equal to or larger than the code value of the stored first reference code, the first code comparison part 540 may activate the duty error determination signal NS.

The adder 510 may be configured to add the first duty information A<1:n> and the second duty information B<1:n>. Then the adder 510 may generate a second code ADD<1:n>.

The second code comparison part 520 may be configured to compare a stored second reference code with the second code ADD<1:n>. Then the second code comparison part 520 may generate a frequency determination signal FS.

The second code comparison part 520 may be configured to activate the frequency determination signal FS. When the code value of the second code ADD<1:n> is equal to or larger than the code value of the stored second reference code, the second code comparison part 520 may activate the frequency determination signal FS.

The output control part 550 may be configured to generate the noise detection signal NDET. The noise detection signal NDET may be generated by the output control part 550 in response to the frequency determination signal FS and the duty error determination signal NS.

The output control part 550 may be configured to generate the noise detection signal NDET. The noise detection signal NDET may be generated by the output control part 550 in response to the activation of the frequency determination signal FS and the duty error determination signal NS.

The output control part 550 may determine that currently generated noise is a high frequency component, when the frequency determination signal FS and the duty error determination signal NS are activated, and may activate the noise detection signal NDET.

That is to say, the output control part 550 may be configured, for example, to detect high frequency noise and activate the noise detection signal NDET.

Additionally, the embodiments may be configured in such a way as not to consider a frequency characteristic. In these embodiments, the detection circuit 500 may be configured by only the subtractor 530 and the first code comparison part 540 and may output the duty error determination signal NS as the noise detection signal NDET.

Figure 4:
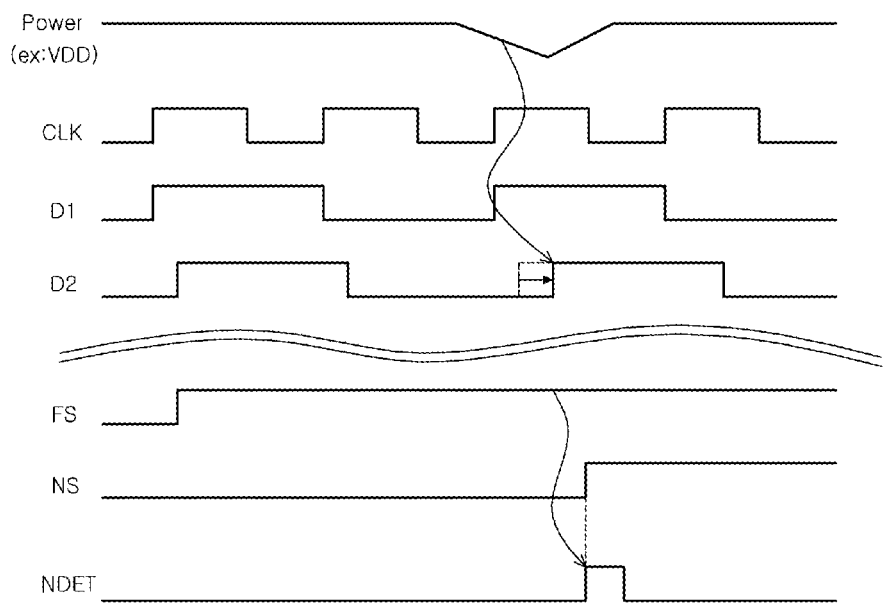
FIG. 4 is a representation of an operation waveform diagram of FIG. 3.

The operations of the noise detection circuit 100 in accordance with the embodiments will be described below with reference to FIG. 4.

In an embodiment, noise generation in units of power may be determined, based on the clock signal CLK.

A power supply voltage VDD is applied, and the first divided signal D1 is generated by dividing the clock signal CLK.

While a level of the power supply voltage VDD retains in a predetermined range of a voltage level, the first reference signal D2 is normally generated by delaying the first divided signal D1.

As the level of the power supply voltage VDD suddenly falls due to power noise, an operation error occurs in the noise detection reference block 300 of FIG. 1, and accordingly, the first reference signal D2 is abnormally delayed.

At a time when the code value of the second code ADD<1:n> is equal to or larger than the code value of the second reference code, the second code comparison part 520 of FIG. 3 activates the frequency determination signal FS.

At a time when the code value of the first code SUB<1:n> is equal to or larger than the code value of the first reference code, the first code comparison part 540 of FIG. 3 activates the duty error determination signal NS.

At a time when both the frequency determination signal FS and the duty error determination signal NS are activated, the output control part 550 generates the noise detection signal NDET of a pulse type.

The first duty information A<1:n> is the high pulse width information of the clock signal CLK. The second duty information B<1:n> is the low pulse width information of the clock signal CLK.

The second code ADD<1:n> which is generated by adding the first duty information A<1:n> and the second duty information B<1:n> may be a code which defines the frequency of the clock signal CLK. The first code SUB<1:n> which is generated by subtracting the first duty information A<1:n> and the second duty information B<1:n> may be a code which defines the duty error of the clock signal CLK, that is, the difference between the high pulse width and the low pulse width of the clock signal CLK.

Accordingly, when the value of the second code ADD<1:n> is equal to or larger than the value of the second reference code which is set to define a high frequency (the value of which may vary according to a semiconductor operating condition), the frequency determination signal FS is activated to define that the clock signal CLK is a high frequency signal.

When the value of the first code SUB<1:n> is equal to or larger than the value of the first reference code which is set to define the duty error of the clock signal not conforming to the operating condition of a semiconductor circuit, the duty error determination signal NS is activated.

In the embodiments where the clock signal CLK is a low frequency signal (the value of which may vary according to the operating condition of a semiconductor circuit), power noise may not exert an adverse influence on the operation of the semiconductor circuit.

Accordingly, in an embodiment, in order to detect high frequency noise, the output control part 550 is configured, for example, to generate the noise detection signal NDET of a pulse type at a time when both the frequency determination signal FS and the duty error determination signal NS are activated.

An embodiment may be configured in such a way as not to consider a frequency characteristic. In these embodiments, the duty error determination signal NS may be outputted as the noise detection signal NDET.

Figure 5:
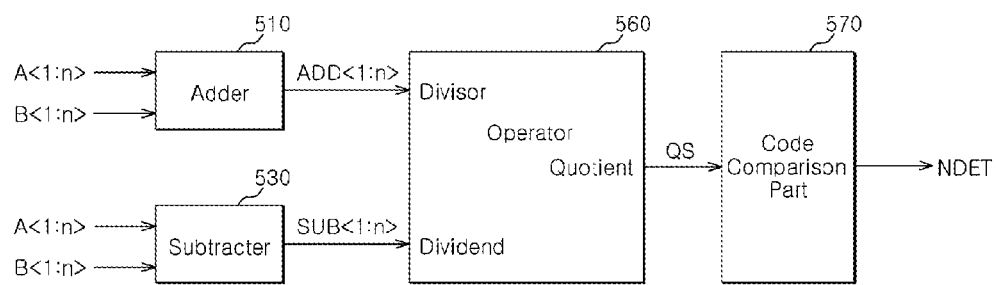
FIG. 5 is a block diagram representation illustrating an example of a configuration of the detection circuit illustrated in FIG. 1.

The detection circuit 500 according to an embodiment may be configured as illustrated in FIG. 5.

The detection circuit 500 may include an adder 510 and a subtractor 530. The detection circuit 500 may also include an operator 560 and a code comparison part 570.

The adder 510 may be configured to add first duty information A<1:n> and second duty information B<1:n>. Then, the adder 510 may generate a second code ADD<1:n>.

The subtractor 530 may be configured to subtract the first duty information A<1:n> and the second duty information B<1:n>. Then, the subtractor 530 may generate a first code SUB<1:n>.

The operator 560 may be configured to divide the first code SUB<1:n> as a dividend by the second code ADD<1:n> as a divisor, and output a quotient (or result of the division) as a duty error determination code QS.

The quotient that is obtained by dividing the first code SUB<1:n> as a dividend by the second code ADD<1:n> as a divisor, that is, the duty error determination code QS, defines to which degree the duty of the clock signal CLK deviates.

The code comparison part 570 may be configured to compare a stored reference code with the duty error determination code QS. Then the code comparison part 570 may generate the noise detection signal NDET.

The reference code which is stored in the code comparison part 570 may be set to define the duty error of the clock signal CLK which does not conform to the operating condition of the semiconductor circuit.

Accordingly, when the value of the duty error determination code QS is equal to or larger than the value of the reference code, the code comparison part 570 activates the noise detection signal NDET.

The noise detection signal NDET generated in this way may be used for controlling the operation of another circuit configuration inside the semiconductor circuit (for example, a memory), and may be provided to an external device (for example, a memory controller such as a CPU or a GPU) of the semiconductor circuit such that the external device may control a memory.

Figure 6:
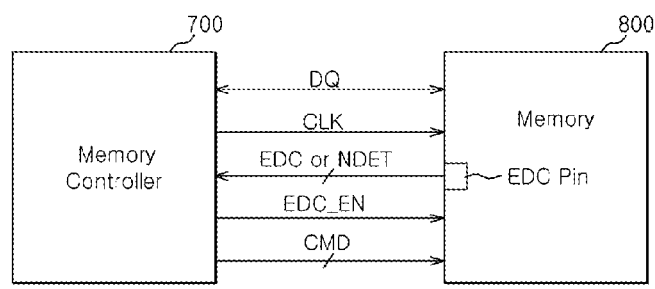
FIG. 6 is a block diagram representation of a semiconductor system in accordance with an embodiment.

As illustrated in FIG. 6, a semiconductor system 600 in accordance with an embodiment may include a memory controller 700 and a memory 800.

The memory controller 700 may include, for example, a CPU or a GPU. The memory 800 may include, for example, a DRAM, a flash RAM, a PCRAM, and so forth.

The memory controller 700 may be configured to determine the operation state of the memory 800, and provide a control signal EDC_EN.

The control signal EDC_EN may be a signal for selecting the error detecting function or the noise detecting function of the memory 800.

The error detecting function is a function whereby the memory 800 provides an error detection code EDC to the memory controller 700. The noise detecting function is a function whereby the memory 800 provides a noise detection signal NDET to the memory controller 700.

The memory controller 700 may activate (to a high level) or deactivate (to a low level) the control signal EDC_EN to select the error detecting function or the noise detecting function of the memory 800.

The memory controller 700 may determine whether the current operation state of the memory 800 needs the error detecting function or not, and may generate the control signal EDC_EN.

The memory controller 700 may transmit and receive data DQ to and from the memory 800.

The memory controller 700 may provide a clock signal CLK to the memory 800.

The memory controller 700 may be provided with the error detection code EDC or the noise detection signal NDET through an error detection code EDC pin from the memory 800.

When the noise detection signal NDET is activated, the memory controller 700 may determine that the currently detected noise is a degree likely to exert an influence on communication with the memory 700. When the noise detection signal NDET is deactivated the memory controller 700 may determine that the currently detected noise is a degree unlikely to exert an influence on communication with the memory 700.

When the noise detection signal NDET is activated, the memory controller 700 may provide a corresponding command CMD to the memory 800.

At this time, or when the noise detection signal NDET is activated, the command provided by the memory controller 700 to the memory 800 may include an interrupt command for temporarily interrupting the operation of the memory 800, a data retransmission command, or the like.

That is to say, when the current noise is serious enough to be equal to or larger than a predetermined value, a probability for an operation error to occur in the memory 800 is substantial, and accordingly, the reliability of the data provided from the memory 800 may be degraded.

Accordingly, when the noise detection signal NDET is activated, the memory controller 700 may temporarily interrupt data transmission of the memory 800 through the command CMD, or may request data retransmission if data has been already transmitted.

The memory 800 may activate and deactivate the internal error detecting function, according to the control signal EDC_EN. The memory 800 may deactivate and activate the noise detecting function, according to the control signal EDC_EN.

When the control signal EDC_EN is activated, the memory 800 may activate the error detecting function and provide the error detection code EDC through the EDC pin to the memory controller 700, and may deactivate the noise detecting function.

When the control signal EDC_EN is deactivated, the memory 800 may deactivate the error detecting function, and activate the noise detecting function and provide the noise detection signal NDET through the EDC pin to the memory controller 700.

In accordance with the command CMD, which is provided from the memory controller 700, the memory 800 may perform data read and write operations.

Figure 7:
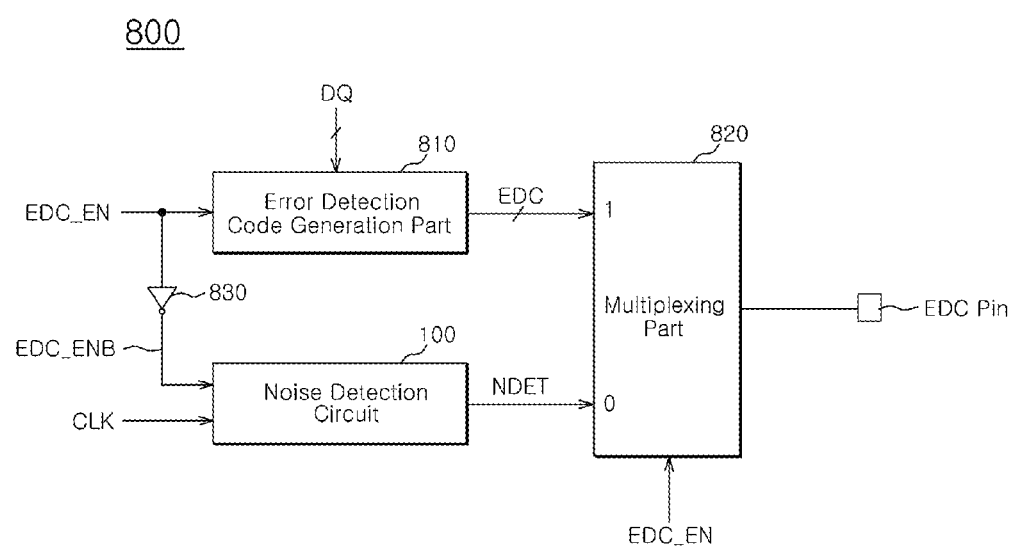
FIG. 7 is a block diagram representation illustrating the configuration of the memory illustrated in FIG. 6.

As illustrated in FIG. 7, the memory 800 may include an error detection code generation part 810 and a noise detection circuit 100. The memory 800 may also include a multiplexing part 820, an inverter 830, and the EDC pin.

The error detection code generation part 810 may be a component element and may perform the error detecting function. The error detection code generation part 810 may be configured to generate the error detection code EDC by using data DQ. The error detection code EDC may be generated in response to the activation of the control signal EDC_EN.

The inverter 830 may be configured to invert the control signal EDC_EN and output an inverted control signal EDC_ENB.

The noise detection circuit 100 may be a component element and may perform the noise detecting function. The noise detection circuit 100 may be configured to generate the noise detection signal NDET by using the clock signal CLK. The noise detection signal NDET may be generated in response to the inverted control signal EDC_ENB.

When the inverted control signal EDC_ENB is activated, that is, in the cases where the control signal EDC_EN is deactivated, the noise detection circuit 100 generates the noise detection signal NDET by using the clock signal CLK.

When the inverted control signal EDC_ENB is deactivated, that is, in the case where the control signal EDC_EN is activated, the noise detection circuit 100 interrupts the operation for generating the noise detection signal NDET.

Since the noise detection circuit 100 may use the configuration described above with reference to FIGS. 1 to 5, the detailed description thereof will be omitted.

The multiplexing part 820 may be configured to output the error detection code EDC or the noise detection signal NDET to the EDC pin in response to the control signal EDC_EN.

When the control signal EDC_EN is in an activated state, the multiplexing part 820 outputs the error detection code EDC to the EDC pin. When the control signal EDC_EN is in a deactivated state, the multiplexing part 820 outputs the noise detection signal NDET to the EDC pin.

Figure 8:
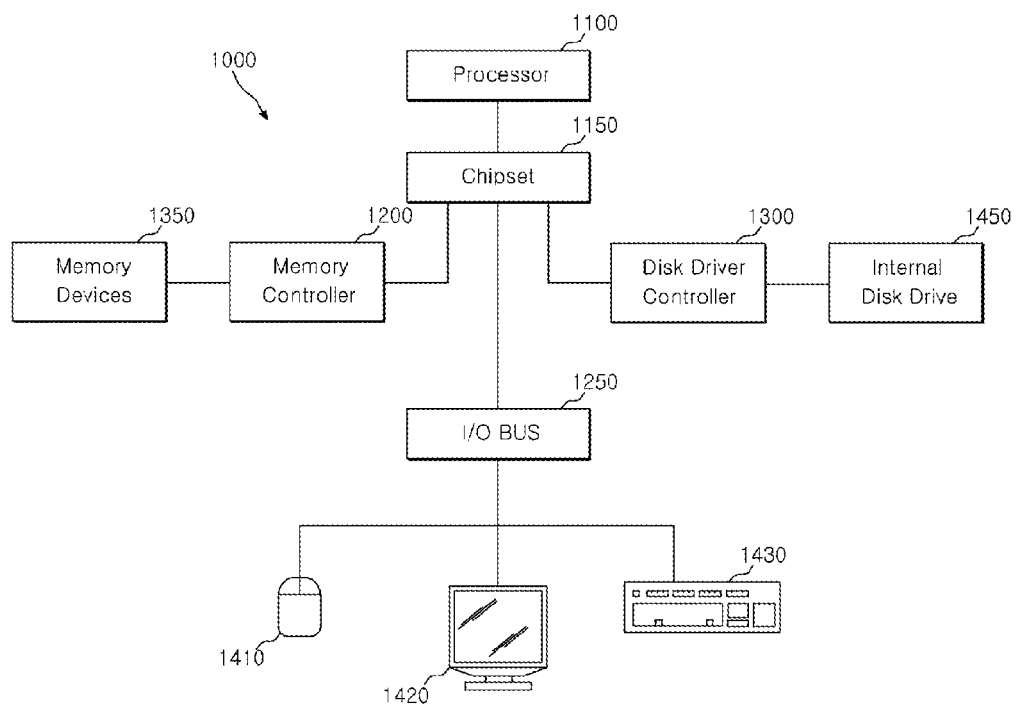
FIG. 8 illustrates a block diagram representation of an example of a system employing the noise detection circuit and/or the semiconductor system in accordance with the embodiments discussed above with relation to FIGS. 1-7.

The semiconductor systems and noise detection circuits discussed above are particular useful in the design of memory devices, processors, and computer systems. For example, referring to FIG. 8, a block diagram of a system employing the semiconductor system and/or noise detection circuit in accordance with the embodiments are illustrated and generally designated by a reference numeral 1000. The system 1000 may include one or more processors or central processing units ("CPUs") 1100. The CPU 1100 may be used individually or in combination with other CPUs. While the CPU 1100 will be referred to primarily in the singular, it will be understood by those skilled in the art that a system with any number of physical or logical CPUs may be implemented.

A chipset 1150 may be operably coupled to the CPU 1100. The chipset 1150 is a communication pathway for signals between the CPU 1100 and other components of the system 1000, which may include a memory controller 1200, an input/output ("I/O") bus 1250, and a disk drive controller 1300. Depending on the configuration of the system, any one of a number of different signals may be transmitted through the chipset 1150, and those skilled in the art will appreciate that the routing of the signals throughout the system 1000 can be readily adjusted without changing the underlying nature of the system.

As stated above, the memory controller 1200 may be operably coupled to the chipset 1150. The memory controller 1200 may include at least one semiconductor system and/or noise detection circuit as discussed above with reference to FIGS. 1-7. Thus, the memory controller 1200 can receive a request provided from the CPU 1100, through the chipset 1150. In alternate embodiments, the memory controller 1200 may be integrated into the chipset 1150. The memory controller 1200 may be operably coupled to one or more memory devices 1350. In an embodiment, the memory devices 1350 may include the semiconductor system and/or noise detection circuit as discussed above with relation to FIGS. 1-7, the memory devices 1350 may include a plurality of word lines and a plurality of bit lines for defining a plurality of memory cell. The memory devices 1350 may be any one of a number of industry standard memory types, including but not limited to, single inline memory modules ("SIMMs") and dual inline memory modules ("DIMMs"). Further, the memory devices 1350 may facilitate the safe removal of the external data storage devices by storing both instructions and data.

The chipset 1150 may also be coupled to the I/O bus 1250. The I/O bus 1250 may serve as a communication pathway for signals from the chipset 1150 to I/O devices 1410, 1420 and 1430. The I/O devices 1410, 1420 and 1430 may include a mouse 1410, a video display 1420, or a keyboard 1430. The I/O bus 1250 may employ any one of a number of communications protocols to communicate with the I/O devices 1410, 1420, and 1430. Further, the I/O bus 1250 may be integrated into the chipset 1150.

The disk drive controller 1450 (i.e., internal disk drive) may also be operably coupled to the chipset 1150. The disk drive controller 1450 may serve as the communication pathway between the chipset 1150 and one or more internal disk drives 1450. The internal disk drive 1450 may facilitate disconnection of the external data storage devices by storing both instructions and data. The disk drive controller 1300 and the internal disk drives 1450 may communicate with each other or with the chipset 1150 using virtually any type of communication protocol, including all of those mentioned above with regard to the I/O bus 1250.

It is important to note that the system 1000 described above in relation to FIG. 8 is merely one example of a system employing the semiconductor system and/or noise detection circuit as discussed above with relation to FIGS. 1-7. In alternate embodiments, such as cellular phones or digital cameras, the components may differ from the embodiments illustrated in FIG. 8.

While various embodiments have been described above, it will be understood to those skilled in the art that the embodiments described are by way of example only. Accordingly, the noise detection circuit and the semiconductor system using the same described herein should not be limited based on the described embodiments.

What is claimed is:

1. A noise detection circuit comprising:
a divider configured to receive a clock signal and a clock bar signal, divide the clock signal and the clock bar signal, and generate a first divided signal and a second divided signal;
a noise detection reference block configured to reflect a power supply voltage level variation on the first divided signal and the second divided signal, and generate a first reference signal and a second reference signal;
a duty sensing circuit configured to generate first duty information and second duty information of the clock signal in response to the first reference signal and the second reference signal; and
a detection circuit configured to generate a noise detection signal in response to the first duty information and the second duty information.

2. The noise detection circuit according to claim 1, wherein the divider comprises:
a first division logic configured to divide the clock signal and generate the first divided signal;
a first transmission gate configured to transmit the clock signal to the first division logic in response to a control signal;
a second division logic configured to divide the clock bar signal and generate the second divided signal; and
a second transmission gate configured to transmit the clock bar signal to the second division logic in response to the control signal.

3. The noise detection circuit according to claim 1, wherein the noise detection reference block is configured to delay the first divided signal and the second divided signal by a predetermined time and generate the first reference signal and the second reference signal, and reflect the power supply voltage level variation on the operation of delaying the first divided signal and the second divided signal.

4. The noise detection circuit according to claim 1, wherein the first duty information may be high pulse width information of the clock signal, and the second duty information may be low pulse width information of the clock signal.

5. The noise detection circuit according to claim 1, wherein the detection circuit comprises:
a subtractor configured to subtract the first duty information and the second duty information, and generate a first code; and
a first code comparison part configured to compare a stored first reference code with the first code, and generate a duty error determination signal.

6. The noise detection circuit according to claim 5, further comprising:
an adder configured to add the first duty information and the second duty information, and generate a second code;
a second code comparison part configured to compare a stored second reference code with the second code, and generate a frequency determination signal; and
an output control part configured to generate the noise detection signal in response to the frequency determination signal and the duty error determination signal.

7. The noise detection circuit according to claim 6, wherein the output control part is configured to activate the noise detection signal when the frequency determination signal and the duty error determination signal are activated.

8. The noise detection circuit according to claim 7,
wherein the frequency determination signal is activated when a code value of the second code is equal to or larger than a code value of the stored second reference code, and
wherein the duty error determination signal is activated when a code value of the first code is equal to or larger than a code value of the stored first reference code.

9. The noise detection circuit according to claim 1, wherein the detection circuit further comprises:
a subtractor configured to subtract the first duty information and the second duty information, and generate a first code;
an adder configured to add the first duty information and the second duty information and generate a second code;
an operator configured to divide the first code by the second code, and output a result of the division of the first code by the second code as a duty error determination code; and
a code comparison part configured to compare a stored reference code with the duty error determination code, and generate the noise detection signal.

10. A noise detection circuit comprising:
a divider configured to receive a clock signal and a clock bar signal, divide the clock signal and the clock bar signal, and generate a first divided signal and a second divided signal; and
a detection circuit configured to generate a noise detection signal with regards the first divided signal and the second divided signal.

* * * * *